United States Patent
Sahu

(10) Patent No.: US 8,830,766 B2
(45) Date of Patent: Sep. 9, 2014

(54) MARGIN FREE PVT TOLERANT FAST SELF-TIMED SENSE AMPLIFIER RESET CIRCUIT

(71) Applicant: LSI Corporation, Milpitas, CA (US)

(72) Inventor: Rahul Sahu, Karnataka (IN)

(73) Assignee: LSI Corporation, Milpitas, CA (US)

( * ) Notice: Subject to any disclaimer, the term of this patent is extended or adjusted under 35 U.S.C. 154(b) by 60 days.

(21) Appl. No.: 13/748,082

(22) Filed: Jan. 23, 2013

(65) Prior Publication Data

US 2014/0204683 A1    Jul. 24, 2014

(51) Int. Cl.
    *G11C 7/00*    (2006.01)

(52) U.S. Cl.
    USPC ...................... 365/189.05; 365/205

(58) Field of Classification Search
    USPC ............................. 365/189.05, 205
    See application file for complete search history.

(56) References Cited

U.S. PATENT DOCUMENTS

| | | | |
|---|---|---|---|
| 5,306,970 A * | 4/1994 | Phillips | ........................ 327/57 |
| 6,535,029 B2 | 3/2003 | Shih et al. | |
| 6,804,164 B2 | 10/2004 | Fujino et al. | |
| 7,339,842 B1 | 3/2008 | Hold | |
| 7,359,281 B2 | 4/2008 | Soares et al. | |

OTHER PUBLICATIONS

LSI Patentability Search Report.

* cited by examiner

*Primary Examiner* — Hoai V Ho

(57) ABSTRACT

In described embodiments, a circuit for providing a margin free PVT tolerant fast self-timed sense amplifier reset includes a sense amplifier coupled between a complementary pair of first and second bitlines in a memory cell, a first and second PMOS drivers connected to internal nodes of the sense amplifier, respectively, and outputting a first and second output signals, wherein the second output signal is inverted by an inverter to form an inverted output signal, a read detect block receiving the first and inverted output signals and generating a transition detect signal that is latched by a cross-coupled inverters and employed to generate a sense amplifier enable signal with a global sense amplifier enable signal, and a push-pull logic formed by a NMOS and a PMOS in series to generate an output of the circuit.

20 Claims, 5 Drawing Sheets

400

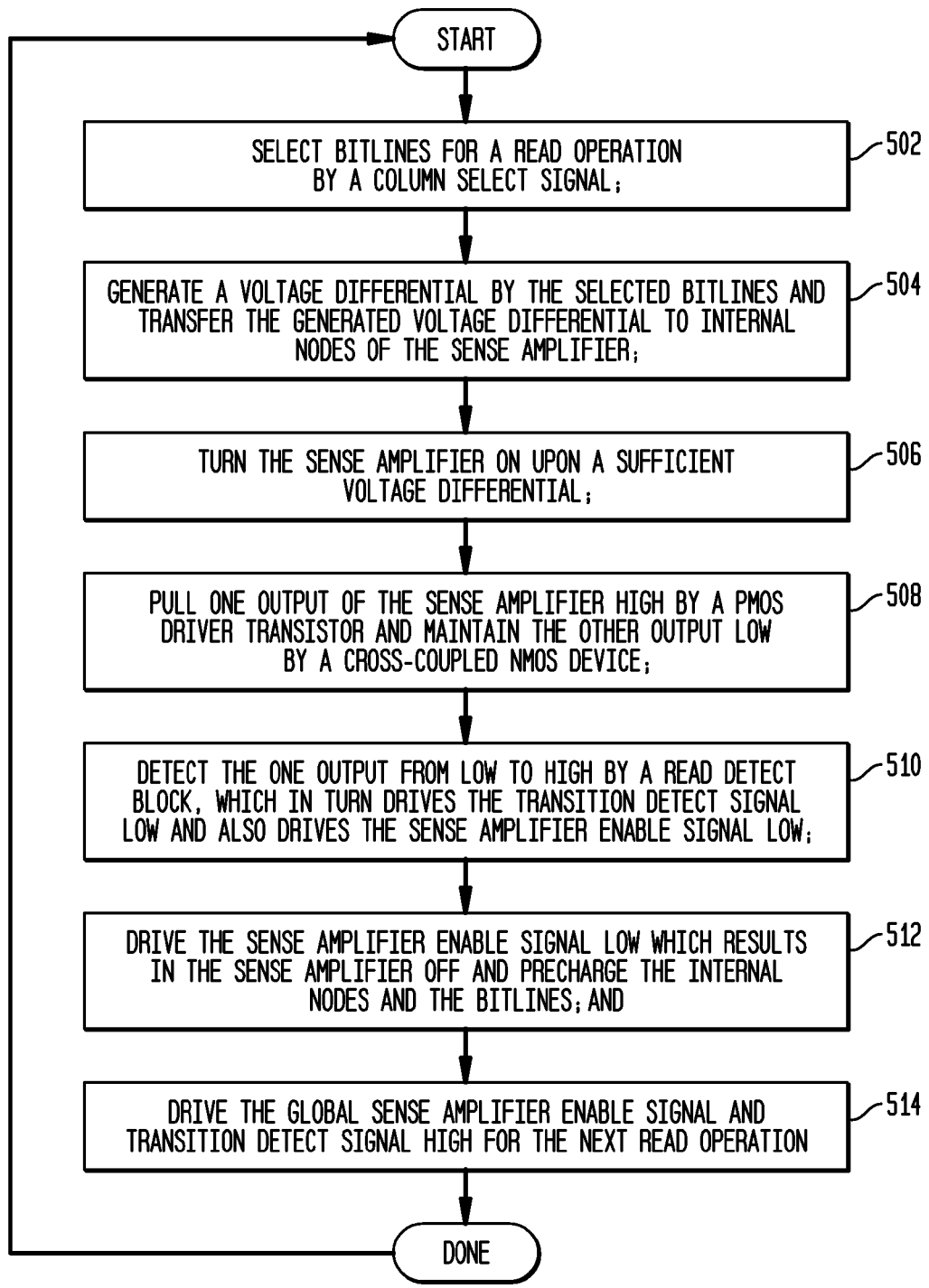

MARGIN FREE PVT TOLERANT FAST SELF-TIMED SENSE AMPLIFIER RESET CIRCUIT

BACKGROUND

In sense amplifier based self-timed memories, two events are crucial for a proper functioning of static random access memories (SRAMs). The first event is a triggering ON of a sense amplifier (SENAMP) when a sufficient differential is developed on bit-lines to read data stored in a bit-cell with a minimum reaction time of the sense amplifier. The other event is a turning OFF of the sense amplifier, when the read data is latched with a safe margin across process, voltage and temperature (PVT) variations. This safe margin can be difficult to achieve across the PVT variations.

It is known that a precharging of internal nodes of the sense amplifier and subsequently, a start of a new cycle, depends on a pulse width of a sense amplifier enable (SAen) signal. Thus, the pulse width of the SAen signal, i.e., resetting of the SAen signal, is crucial for an efficient cycle time.

Generally, the triggering ON of the sense amplifier can be managed through tracking schemes like bit-line tracking approach. However, the turning OFF of the sense amplifier requires some efficient schemes to successfully latch read data without penalizing cycle time across PVT variation.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a circuit for providing a margin free PVT tolerant fast self-timed sense amplifier reset including a sense amplifier coupled between a complementary pair of first and second bitlines in a memory cell, a first and second PMOS drivers connected to internal nodes of the sense amplifier, respectively, and outputting a first and second output signals, wherein the second output signal is inverted by an inverter to form an inverted output signal, a read detect block receiving the first and inverted output signals and generating a transition detect signal that is latched by a cross-coupled inverters and employed to generate a sense amplifier enable signal with a global sense amplifier enable signal, and a push-pull logic formed by a NMOS and a PMOS in series to generate an output of the circuit. In a read cycle, with an initial state of the global sense amplifier enable signal LOW, the transition detect signal HIGH and the first and inverted output signals LOW, the first PMOS driver pulls the inverted output signal HIGH, and a cross-coupled NMOS device maintains the first output signal LOW. The read detect detects the transition of the inverted output to the HIGH state that drives the transition detect signal LOW and in turn drives the sense amplifier OFF and then precharges the internal nodes of the sense amplifier and the bitlines for the next read cycle.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

FIG. 5 is a flowchart showing a method for resetting the sense amplifier enable signal in a fast way with 100% assurance of successful reading of data across PVT variation shown in FIG. 1.

DETAILED DESCRIPTION

Described embodiments relate to a device and method for resetting a sense amplifier without penalizing a cycle time that ensures a latching of read data with sufficiently safe margin across PVT variations. In the described embodiments, a SAen signal is reset in a fast way with 100% assurance of successful reading of data across the PVT variations, which helps improving the cycle time of memories across the PVT variations. Further, the SAen signal does not require any margin with respect to the data latched. Thus, the described embodiments are a margin free local self-reset technique, which improves the cycle time significantly, especially for wider memories.

Figure 1:
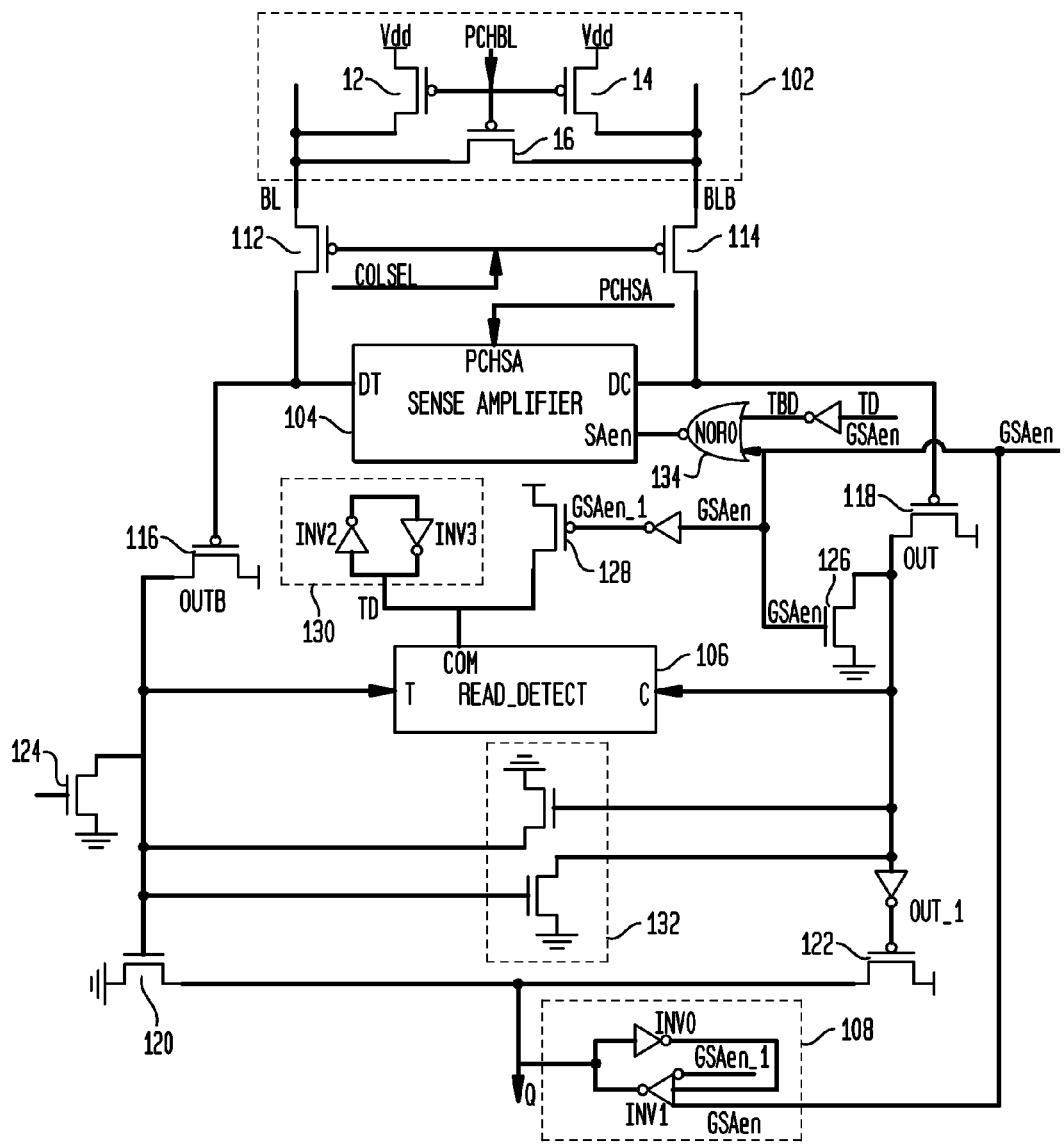
FIG. 1 is a schematic view of a margin free PVT tolerant fast self-timed sense amplifier reset circuit in a SRAM cell in accordance with exemplary embodiments.

The described embodiments are based on a detection of swing of internal nodes of the sense amplifier when the sense amplifier reads the data. FIG. 1 is a schematic view of a margin free PVT tolerant fast self-timed sense amplifier reset circuit in a SRAM cell in accordance with exemplary embodiments.

As shown in FIG. 1, memory circuit 100 includes bitline (BL) precharging circuit 102, sense amplifier (SA) 104, read detect block 106, and control latch 108. Memory circuit 100 further includes PMOS pass transistors 112 and 114, PMOS driver transistors 116 and 118, NMOS transistors 120, 124 and 126, PMOS transistor 122, precharge PMOS transistor 128, cross-coupled inverters 130, cross-coupled NMOS device 132, and NOR gate 134. Here, NMOS transistor 120 and PMOS transistor 122 form a push-pull logic.

BL precharge circuit 102 is formed with three PMOS transistors 12, 14, 16 each having a gate node connected together to receive a precharge BL signal (PCHBL). The PCHBL signal controls PMOS transistors 12, 14 and 16. Bitline precharge circuit 102 precharges and equalizes PMOS transistors 12, 14 and 16 for bitlines, BL and BLB of a column. PMOS transistors 12, 14 and 16 are used to precharge the BL and BLB to the drain supply voltage ($V_{dd}$) and equalize the BL and BLB at $V_{dd}$. When precharging the BL and BLB, the PCHBL signal is set LOW (e.g., or ground) and all three PMOS transistors 12, 14 and 16 work (see FIG. 4). Here, PMOS transistors 12 and 14 act as resistances connecting the BL and BLB to $V_{dd}$. PMOS transistor 16 speeds up a read operation by helping equalize voltages charged on the BL and BLB. The PCHBL signal is HIGH (i.e., $V_{dd}$) when charging the BL and BLB is complete.

The BL and BLB are connected to internal nodes (i.e. DT and DC), respectively, of SA 104 and PMOS driver transistors 116, 118, respectively, through PMOS pass transistors 112, 114. A gate node of PMOS pass transistor 112 is connected to a gate node of PMOS pass transistor 114 and a column select signal (COLSEL) is input into the gate nodes of PMOS transistors 112, 114.

Figure 2:
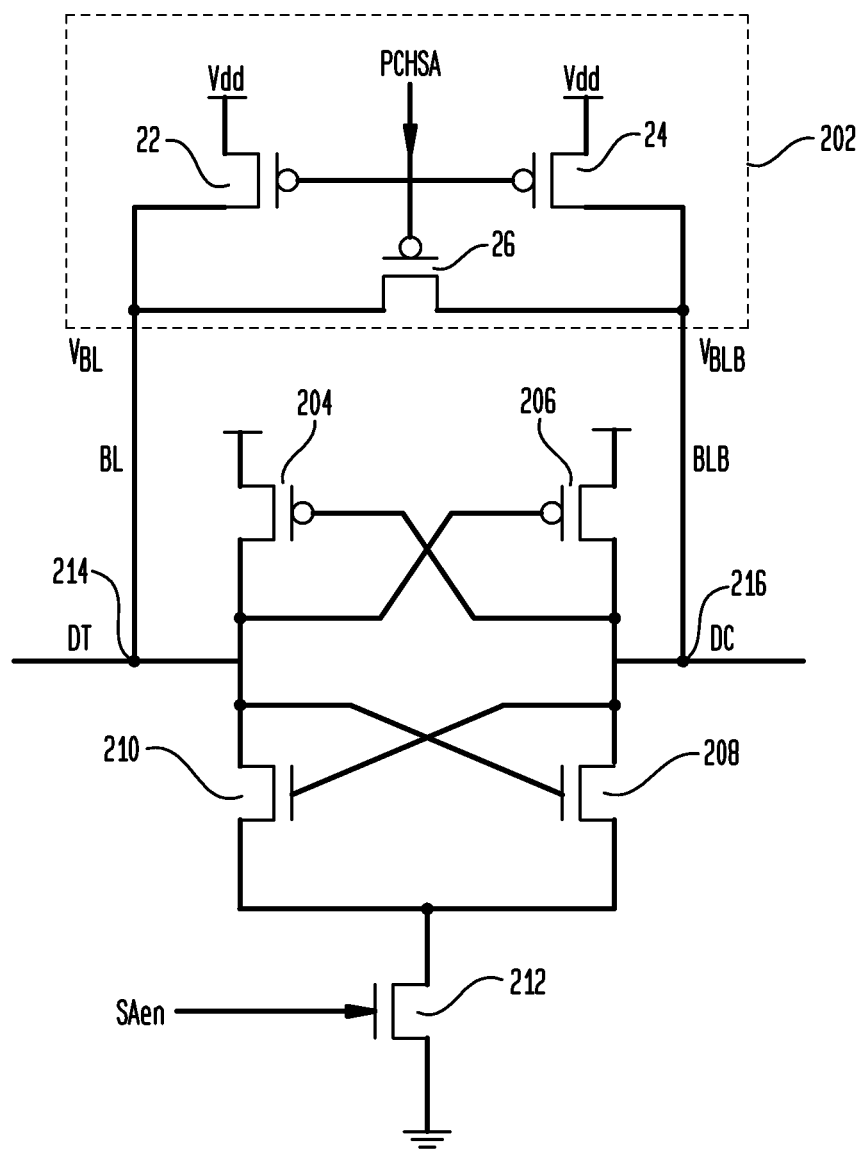
FIG. 2 is a simplified schematic diagram of an exemplary sense amplifier for the margin free PVT tolerant fast self-timed sense amplifier reset circuit shown in FIG. 1.

FIG. 2 is a simplified schematic diagram of an exemplary sense amplifier for the margin free PVT tolerant fast self-timed sense amplifier reset circuit shown in FIG. 1. As shown, sense amplifier 200 includes SA precharge circuit 202, PMOS transistors 204 and 206, NMOS transistors 208 and 210, NMOS latch enable transistor 212, output DT node 214 and output DC node 216. Here, DT and DC are internal nodes and SAen is the sense amplifier enable signal.

SA precharge circuit 202 is formed with three PMOS transistors 22, 24 and 26 having similar configuration to BL precharge circuit 102. PMOS transistors 22, 24 and 26 each have a gate node connected together to receive a precharge SA signal (PCHSA). Here the PCHSA signal may be the same signal as the PCHBL signal. The PCHSA signal controls PMOS transistors 22, 24 and 26. SA precharge circuit 202 precharges and equalizes PMOS transistors 22, 24 and 26 for the BL and BLB. PMOS transistors 22, 24 and 26 are used to precharge the BL and BLB to the drain supply voltage (Vu) and equalize the BL and BLB at $V_{dd}$. When precharging the BL and BLB, the PCHSA signal is set LOW (e.g., 0 or ground) and all three PMOS transistors 22, 24 and 26 are turned ON (see FIG. 4). Here, PMOS transistors 22 and 24 act as resistances connecting the BL and BLB to $V_{dd}$. PMOS transistor 26 speeds up a read operation by helping equalize voltages charged on the BL and BLB. The PCHBL signal is HIGH (i.e., $V_{dd}$) when charging the BL and BLB is complete.

SA 200 is a memory latched formed with two cross-coupled CMOS inverters including PMOS transistors 204, PMOS transistor 206. NMOS transistor 208, and NMOS transistor 210. NMOS latch enable transistor 212 is connected to a sense amplifier enable signal (SAen). The SAen signal is applied to turn SA 200 ON and OFF. During a read operation, a small voltage develops between the BL and BLB with $V_{BL} > V_{BLB}$.

Sense amplifier precharge circuit 202, when the PCHSA goes HIGH prior to the read operation, all three PMOS transistors 22, 24, 26 conduct. PMOS transistors 22, 24 precharge the BL and BLB to $V_{dd}/2$. PMOS transistor 26 helps to speed up this process by equalizing the initial voltages on the two lines. This equalization is critical to the proper operation of SA 200. SA 200 can erroneously interpret the any voltage difference present between the BL and BLB prior to the commencement of the read operation.

Returning to FIG. 1, sense amplifier output signals OUTB and OUT driven by PMOS driver transistors 116, 118, respectively, is sent to NMOS 120 and PMOS 122, respectively. The OUT signal is forwarded to PMOS 122 through an inverter that inverts the OUT signal to OUT_1 signal and the OUT_1 signal is connected to PMOS 122. The OUTB and OUT signal is sent to NMOS 124, 126, respectively, which keep the OUTB and OUT signal LOW when a global sense amplifier enable signal (GSAen) is HIGH. The GSAen signal can be generated through any of conventional tracking schemes, for example, a bitline tracking approach.

Control latch 108 includes an inverter INV0 and a tristate inverter INV1 cross-coupled to capture a final output Q. The GSAen and a GSAen_1 signals are input into the tristate inverter INV1. The GSAen_1 signal is an inversion of the GSAen signal.

NOR gate 134 (e.g., NOR0) is a NOR gate to generate a sense amplifier enable signal (SAen) with two inputs that are the GSAen and a TDB signals. The TDB signal is an inversion of transition detect (TD) signal.

The OUT and OUTB signal are sent to C and T nodes of read detect block 106, respectively. COM node of read detect block 106 is connected to precharge device 128. The GSAen_1 signal connected to precharge device 128. The TD signal is generated at the COM node of read detect block 106 and the state of the TD signal is latched by cross coupled inverters 130, which includes invertors NV2 and INV3.

Figure 3:
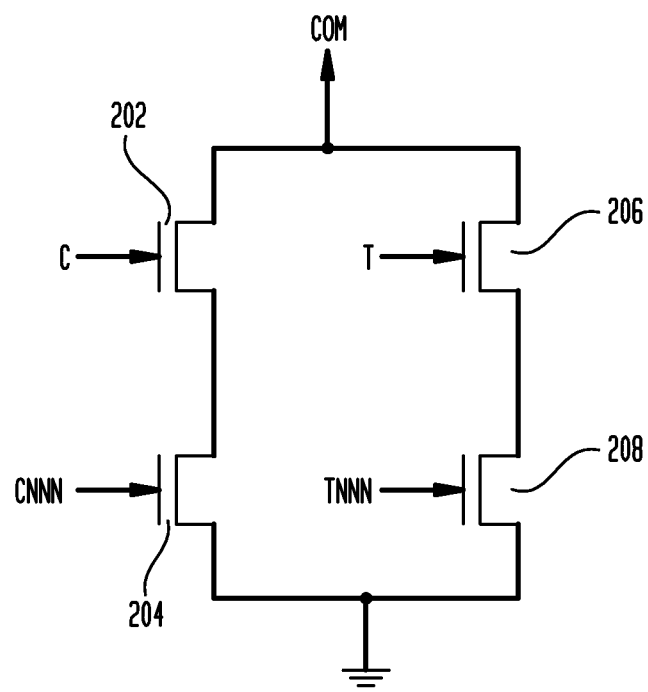
FIG. 3 is a simplified schematic diagram of an exemplary read detect circuit for the margin free PVT tolerant fast self-timed sense amplifier reset circuit of FIG. 1.
Figure 3:
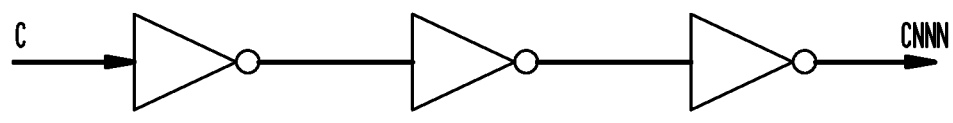
Figure 3:
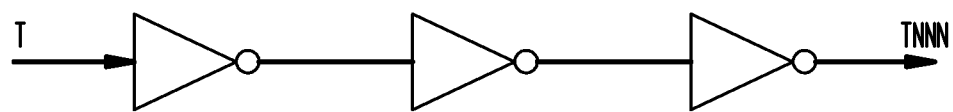

FIG. 3 is a simplified schematic diagram of an exemplary read detect circuit for the margin free PVT tolerant fast self-timed sense amplifier reset circuit of FIG. 1. As shown, read detect circuit 300 includes transistors 202, 204, 206, 208. The gate node of each transistor is labeled. The gate node of transistor 202 is labeled C; the gate node of transistor 204 is labeled CNNN; the gate node of transistor 206 is labeled T; the gate node of transistor 208 is labeled TNNN. The CNNN and TNNN nodes have opposite polarity to the C and T nodes, respectively. The nodes C and CNNN form a leg, and the nodes T and TNNN form another leg. Whenever, there is any transition from LOW to HIGH on any of the nodes C and T, one of the legs C and CNNN or T and TNNN provides a path to ground for the duration equivalent to three inverter delays, as shown in the lower part of FIG. 3, which in turn pulls the COM node LOW.

Figure 4:
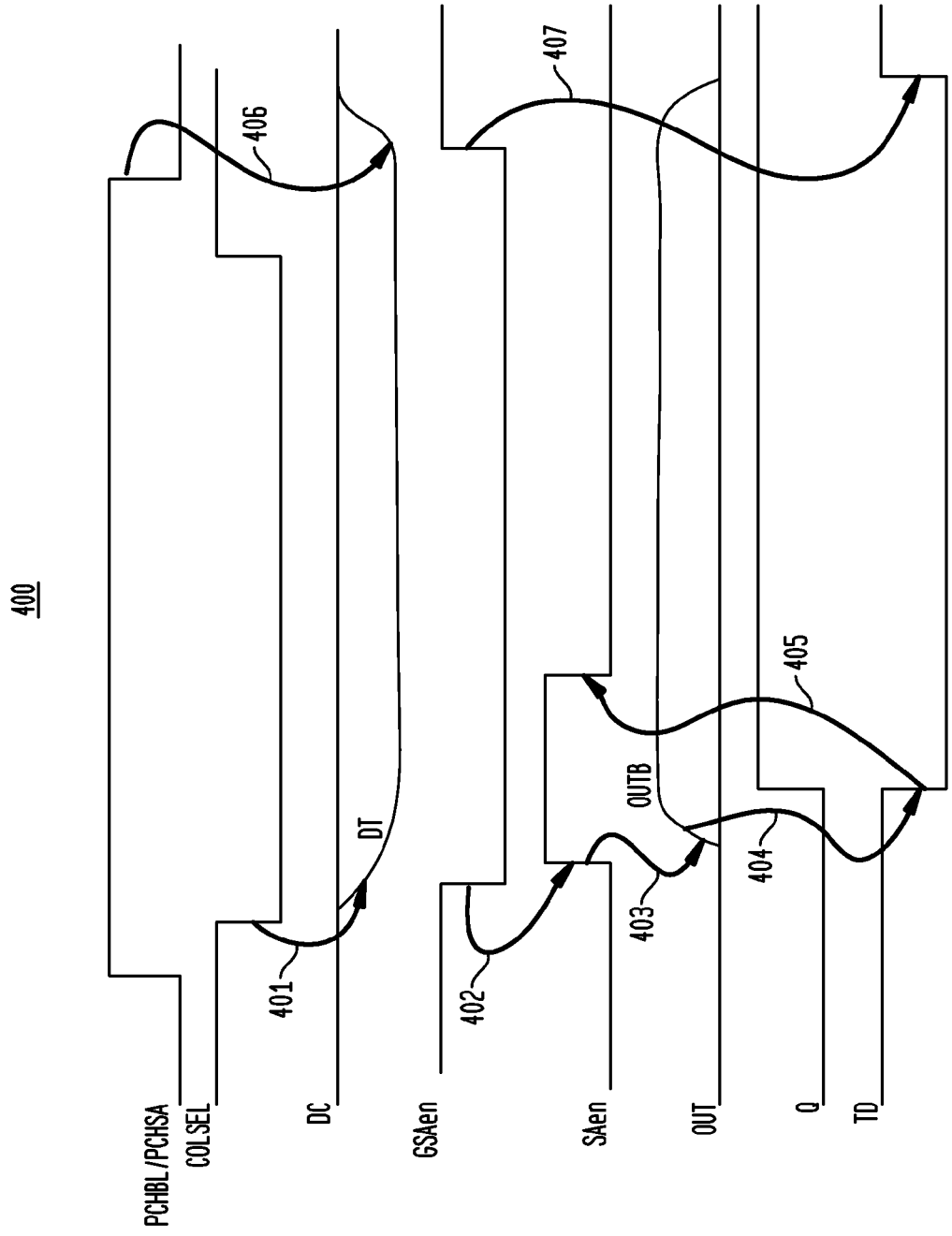
FIG. 4 is a timing diagram showing exemplary waveforms of the margin free PVT tolerant fast self-timed sense amplifier reset circuit shown in FIG. 1.

FIG. 4 is a timing diagram showing exemplary waveforms of the margin free PVT tolerant fast self-timed sense amplifier reset scheme shown in FIG. 1. The operation of the margin free PVT tolerant fast self-timed sense amplifier reset circuit in a SRAM cell shown in FIG. 1 can be understood by waveforms given in FIG. 4.

The arrows in FIG. 4 represent the sequence of events. As shown in FIG. 4, the PCHBL and PCHSA are turned OFF before bit-lines of a column are selected for a read operation, i.e. before the COLSEL is asserted LOW. The selected bit-lines start transferring the generated voltage differential to the internal nodes (i.e., DT and DC) of the sense amplifier at event 401. The initial state of the TD signal is HIGH and OUT and OUTB are LOW, because the GSAen is HIGH. When a sufficient voltage differential is generated on the bit-lines-internal nodes, the SAen is turned ON/HIGH by asserting the GSAen LOW at event 402. The GSAen signal is controlled by any of conventional self-time techniques, such as a bit-line tracking, etc. When the SAen is HIGH, the sense amplifier is resolved fully, i.e., in this particular case, the DT goes to LOW and the DC remains HIGH. The GSAen LOW state stops the pre-discharging of the OUT and OUTB nodes, before the SAen goes HIGH. Then, PMOS driver transistor 116 is ON and pulls the OUTB node HIGH at event 403, but PMOS driver transistor 118 is OFF because the DC is HIGH. Cross-coupled NMOS device 132 maintains the OUT node LOW. Control latch 108 is disabled by the LOW state of the GSAen. The push-pull logic formed by NMOS 120 and PMOS 122 drives the Q node HIGH. The transition of the OUTB node to the HIGH state is detected by read detect block 106, which drives the TD node LOW (at event 404) and in turn derives the SAen LOW (at event 405). The sense amplifier is then OFF and the pre-charging of the internal nodes and/or bitlines is started at event 406. The tracking circuitry used for controlling the GSAen signal drives the GSAen HIGH which in turn drives the TD node HIGH at event 407, which is ready for the next cycle read operation.

FIG. 5 is a flowchart showing a method for resetting the sense amplifier enable signal in a fast way with 100% assurance of successful reading of data across PVT variations shown in FIG. 1 in accordance with an exemplary embodiment of the present invention.

As shown, at step 502, the PCHBL and PCHSA signals are turned OFF before bitlines are selected by the COLSEL signal for a read operation, i.e. before the COLSEL is asserted LOW. At step 504, the selected bitlines generate a voltage differential and transfer the generated voltage differential to the internal nodes of the sense amplifier. At step 506, the SAen is turned ON with a sufficient voltage differential generated on the bitlines and the internal nodes. The GSAen is controlled by any of conventional self-time techniques like bit-line tracking, etc., is LOW. When the SAen is HIGH, the sense amplifier is resolved fully, i.e., in a particular case, the DT goes to LOW and the DC remains HIGH. The GSAen LOW state stops the pre-discharging of the OUT and OUTB nodes, before the SAen goes HIGH. At step 508, the OUTB is pulled HIGH by PMOS driver transistor 116. Here, PMOS driver transistor 118 is OFF because the DC is HIGH. Cross-coupled NMOS device 132 maintains the OUT node LOW. Control latch 108 is disabled by the LOW state of the GSAen. The push-pull logic formed by NMOS 120 and PMOS 122 drives the Q node HIGH. At step 510, the TD node is driven LOW by a transition of the OUTB node to a HIGH state. The transition of the OUTB node to the HIGH state is detected by read detect block 106. At step 512, the SAen is driven LOW by the transition of the OUTB node to the HIGH state. The sense amplifier is then OFF and the internal nodes and/or bitlines is precharged. At step 514, the GSAen is driven HIGH by the tracking circuitry and the TD is also driven HIGH. Thus, memory circuit 100 is ready for the next cycle read operation.

The present invention provides a precise pulse width of the SAen with 100% assurance of successful reading of data across the PVT variations, because the read data itself triggers a reset of the SAen pulse. The accurate and precise pulse width improves the operating frequency, i.e., small and efficient cycle time, because the faster the reset of the SAen pulse, the faster is the pre-charge operation of the internal nodes, DT and DC, of the sense amplifier. Because the OUT/OUTB itself is triggering the reset of the SAen signal, so there is no margin involved between the OUT/OUTB and SAen reset. For example, in 28 nm technology node, for a memory instance with 64 words and 128 bits, the cycle time may be improved by 50 picoseconds (ps) to 60 ps at for the PVT condition SS/0.81 v/0 c by using the method disclosed in the present invention.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the embodiments are not so limited. As would be apparent to one skilled in the art, various functions of circuit elements may also be implemented as processing blocks in a software program. Such software may be employed in, for example, a digital signal processor, micro-controller, or general purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the embodiment is implemented using bi-polar transistor technology.

No claim element herein is to be construed under the provisions of 35 U.S.C. §112, sixth paragraph, unless the element is expressly recited using the phrase "means for" or "step for."

It will be further understood that various changes in the details, materials, and arrangements of the parts which have been described and illustrated in order to explain the nature of described embodiments may be made by those skilled in the art without departing from the scope as expressed in the following claims.

I claim:

1. A circuit for providing a margin free PVT tolerant fast self-timed sense amplifier reset, comprising:
    a sense amplifier coupled between a complementary pair of first and second bitlines in a memory cell;
    a first and second PMOS drivers connected to internal nodes of the sense amplifier, respectively, and outputting a first and second output signals, wherein the second output signal is inverted by an inverter to form an inverted output signal;
    a read detect block receiving the first and inverted output signals and generating a transition detect signal that is latched by a cross-coupled inverters and employed to generate a sense amplifier enable signal with a global sense amplifier enable signal; and
    a push-pull logic formed by a NMOS and a PMOS in series to generate an output of the circuit,
    wherein, in a read cycle, with an initial state of the global sense amplifier enable signal LOW, the transition detect signal HIGH and the first and inverted output signals LOW, the first PMOS driver pulls the inverted output signal HIGH, and a cross-coupled NMOS device maintains the first output signal LOW,
    wherein the read detect detects the transition of the inverted output to the HIGH state that drives the transition detect signal LOW and in turn drives the sense amplifier OFF and then precharges the internal nodes of the sense amplifier and the bitlines for the next read cycle.

2. The circuit of claim 1, wherein the sense amplifier is coupled between the complementary pair of the first and second bitlines through pass transistors, respectively, gates of the pass transistors are connected together to receive a column select signal that selects to the bitlines in the read cycle.

3. The method of claim 1, wherein the sense amplifier includes a sense amplifier precharge circuit and two cross-coupled CMOS inverters.

4. The circuit of claim 1, wherein the output of the circuit is captured by a controlled latch formed by an inverter and a tristate inverter cross-coupled together, the global sense amplifier enable signal and an inverted global sense amplifier enable signal are input into the tristate inverter.

5. The circuit of claim 1, wherein the control latch is disabled when the global sense amplifier enable signal is LOW.

6. The circuit of claim 1, wherein the global sense amplifier enable signal is generated by a bit-line tracking technique.

7. The circuit of claim 1, wherein the sense amplifier enable signal is generated by the transition detect signal and the global sense amplifier enable signal applied to a NOR gate.

8. The circuit of claim 1, wherein the read detect circuit includes four NOMS transistors forming two legs, each leg has two transistors connected in series and having opposite polarity.

9. The circuit of claim 8, wherein, when a transition from LOW to HIGH occurs on a node of one of the four NMOS transistors, the respective leg provides a path to ground for a duration equivalent to three inverter delays.

10. The circuit of claim 9, wherein, in the read cycle, when a transition from LOW to HIGH occurs on one transistor in the each leg of the transistors, the each leg of the transistors provides a path to ground for a duration equivalent to three inverter delays, which in turn pulls a common node of the read detect circuit LOW.

11. The circuit of claim 1, further comprising a bitline precharging circuit for precharging the bitlines, wherein the bitline precharging circuit connects to the internal nodes of the sense amplifier through respective PMOS pass transistors.

12. The circuit of claim 11, wherein the column select signal is applied to the gates of the two PMOS pass transistor for selecting the bitlines.

13. The circuit of claim 1, wherein the one of the two outputs of the sense amplifier is passed through a first PMOS driver transistor and the other output is passed through a second PMOS driver transistor.

14. The circuit of claim 1, wherein the common node of the read detect block is connected to a PMOS precharge device that is triggered by the inverted global sense amplifier enable signal.

15. The circuit of claim 1, wherein the push-pull logic includes a PMOS transistor and a NMOS transistor that are connected in series, the output of the circuit is formed at the common node of the PMOS and NMOS transistors.

16. A method for a margin free PVT tolerant fast self-timed sense amplifier reset circuit, the method comprising the steps of:
    selecting bitlines for a read cycle by a column select signal;
    generating a voltage differential by the selected bitlines and transferring the generated voltage differential to internal nodes of a sense amplifier;
    turning the sense amplifier ON upon a sufficient voltage differential generated by the selected bitlines;
    setting a global sense amplifier enable signal LOW that stops pre-discharging two outputs of the sense amplifier, wherein the global sense amplifier enable signal combining with a transition detect signal generated by a read detect block is applied to generate a sense amplifier enable signal for the sense amplifier,
    wherein one internal node of the sense amplifier goes to LOW, the other internal node remains HIGH, the two outputs of the sense amplifier are LOW, and the transition detect signal is HIGH;

pulling one of the two outputs of the sense amplifier HIGH by a PMOS driver transistor and maintaining the other output LOW by a cross-coupled NMOS device;

detecting the transition of the one of the two outputs of the sense amplifier from LOW to HIGH by a read detect block, which in turn drives the transition detect signal and the sense amplifier enable signal LOW;

turning the sense amplifier OFF and precharging the internal nodes and the bitlines; and driving the global sense amplifier enable signal and transition detect signal HIGH for the next read cycle.

17. The method of claim 16, wherein the global sense amplifier enable signal is generated by a bit-line tracking technique.

18. The method of claim 17, wherein the sense amplifier enable signal is generated by a NOR gate that receives the global sense amplifier enable signal and an inverted transition detect signal.

19. The method of claim 16, wherein the read detect block receives the two outputs of the sense amplifier and outputs the transition detect signal.

20. The method of claim 19, wherein the state of the transition detect signal is latched by a cross-coupled inverters.

* * * * *